(12) United States Patent
Witt

(10) Patent No.: US 10,109,524 B2
(45) Date of Patent: Oct. 23, 2018

(54) RECESSING OF LINER AND CONDUCTOR FOR VIA FORMATION

(71) Applicant: GLOBALFOUNDRIES Inc., Grand Cayman (KY)

(72) Inventor: Christian A. Witt, Woodbridge, CT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 16 days.

(21) Appl. No.: 15/413,710

(22) Filed: Jan. 24, 2017

(65) Prior Publication Data

US 2018/0211873 A1 Jul. 26, 2018

(51) Int. Cl.
*H01L 21/768* (2006.01)
*H01L 21/3213* (2006.01)
*H01L 23/532* (2006.01)

(52) U.S. Cl.
CPC .. *H01L 21/76892* (2013.01); *H01L 21/32134* (2013.01); *H01L 21/76843* (2013.01); *H01L 21/76865* (2013.01); *H01L 21/76877* (2013.01); *H01L 21/76883* (2013.01); *H01L 21/76889* (2013.01); *H01L 23/53266* (2013.01)

(58) Field of Classification Search
CPC ......... H01L 21/76853; H01L 21/76883; H01L 21/76897; H01L 23/5226; H01L 21/76892; H01L 21/76886–21/76889; H01L 21/76865; H01L 21/76838–21/76898; H01L 23/53228–23/53238; H01L 21/76843; H01L 21/76849; H01L 21/76834; H01L 21/32134; H01L 21/76877; H01L 21/76805; H01L 21/76831; H01L 21/7684
See application file for complete search history.

(56) References Cited

U.S. PATENT DOCUMENTS

| | | | | |
|---|---|---|---|---|
| 5,175,118 | A * | 12/1992 | Yoneda | H01L 21/28525 257/E21.166 |
| 5,801,444 | A | 9/1998 | Aboelfotoh et al. | |
| 6,114,243 | A * | 9/2000 | Gupta | H01L 21/7684 257/E21.583 |
| 6,261,953 | B1 * | 7/2001 | Uozumi | C23C 22/63 257/E21.589 |
| 6,638,775 | B1 * | 10/2003 | Kweon | H01L 21/28518 257/E21.011 |

(Continued)

*Primary Examiner* — Marvin Payen
*Assistant Examiner* — Jeremy Joy
(74) *Attorney, Agent, or Firm* — Anthony Canale; Hoffman Warnick LLC

(57) ABSTRACT

The disclosure relates to integrated circuit (IC) fabrication techniques. Methods according to the disclosure can include: forming a reaction layer on the upper surface of a conductor, the upper surface of a refractory metal liner, and the upper surface of an insulator layer; annealing the reaction layer such that a portion of the reaction layer reacts with the conductor to form a semiconductor-metal alloy region; removing a portion of the reaction layer to expose the refractory metal liner; removing a portion of the refractory metal liner to approximately a depth of the semiconductor-metal alloy region; and removing the semiconductor-metal alloy region to expose a portion of the conductor such that a remainder of the conductor and a remainder of the refractory metal liner are recessed relative to an upper surface of the insulator layer.

19 Claims, 13 Drawing Sheets

(56) References Cited

U.S. PATENT DOCUMENTS

| | | | |
|---|---|---|---|
| 7,056,780 B2 | 6/2006 | Brask et al. | |
| 8,193,087 B2* | 6/2012 | Shih | H01L 21/02074 257/210 |
| 8,431,482 B1* | 4/2013 | Ryan | H01L 23/535 257/750 |
| 9,324,650 B2* | 4/2016 | Edelstein | H01L 23/5226 |
| 2002/0192940 A1* | 12/2002 | Lee | H01L 21/3212 438/633 |
| 2004/0113279 A1* | 6/2004 | Chen | H01L 21/76834 257/774 |
| 2005/0009328 A1* | 1/2005 | Park | H01L 21/02063 438/666 |
| 2005/0014360 A1* | 1/2005 | Yu | H01L 21/76849 438/622 |
| 2005/0106859 A1* | 5/2005 | Kim | H01L 21/28518 438/655 |
| 2007/0238287 A1* | 10/2007 | Greeley | H01L 21/32134 438/629 |
| 2008/0041823 A1* | 2/2008 | La | C03C 15/00 216/97 |
| 2011/0229761 A1* | 9/2011 | Cui | H01M 4/134 429/218.1 |
| 2013/0078798 A1* | 3/2013 | Sun | H01L 21/823871 438/643 |
| 2014/0159171 A1* | 6/2014 | Cai | H01L 29/785 257/412 |
| 2014/0197468 A1* | 7/2014 | Xie | H01L 29/78 257/288 |
| 2015/0126028 A1* | 5/2015 | Ryan | H01L 21/76883 438/653 |
| 2015/0171084 A1* | 6/2015 | Lin | H01L 27/0922 257/369 |
| 2015/0364326 A1* | 12/2015 | Xie | H01L 29/665 257/288 |
| 2016/0315045 A1* | 10/2016 | Baek | H01L 23/5283 |

\* cited by examiner

RECESSING OF LINER AND CONDUCTOR FOR VIA FORMATION

BACKGROUND

Technical Field

The present disclosure relates to methods of forming integrated circuit (IC) structures, e.g., to align a conductor with a subsequently formed via. Embodiments of the present disclosure include methods of forming an IC structure with recessed conductor(s) and refractory metal liner(s) for alignment with a via in a subsequent metallization over the conductors.

Related Art

Each IC can be made up of billions of interconnected devices, such as transistors, resistors, capacitors, and diodes, located on one or more chips of semiconductor substrate material. The quality and viability of a product including an IC can be at least partially dependent on the techniques used for fabricating the IC and the structure of various components therein. Fabrication of an IC can include two phases: front-end-of-line processes (FEOL) and back-end-of-line processes (BEOL). FEOL generally includes fabrication processes performed on a wafer up to forming a first "metal level," i.e., a metal wire for connecting several semiconductor devices together. In the case of a transistor, a group of vertically-extending conductive contacts can provide electrical connections to the transistor from other functional elements of a circuit. BEOL generally includes fabrication processes following the formation of the first metal level, including the formation of all subsequent metal levels. Each metal level can include metal wires therein, which can be connected to other metal levels through vertically-oriented conducting wires known as vias. In conventional BEOL processing, a layer of vias is formed to connect devices in an IC structure to a layer of metal wires formed on top of the vias, with a successive layer of vias formed thereon, followed by another layer of metal wires, etc. To provide greater scaling and sophistication of the fabricated device, the number of metal levels can be varied to suit a particular application, e.g., by providing four to six metal levels, or as many as, in a further example, sixteen or more metal levels.

To electrically couple two successive levels together, vias may be formed together with the next metal wire after a preceding metal layer has been fabricated. To align each successive metal wire and via with a previously formed metal wire or portion thereof, a fabricator may use masking materials to align the next metal wire with a portion of the existing metal wire. Such alignment processes may risk the forming of "unlanded vias," in which the via may connect at least partially to dielectric material or other non-conductive material instead of an exposed portion of the underlying metal wire. To reduce the presence of unlanded vias in a structure, a fabricator may introduce a varied topography (e.g., differences in thickness between elements) in the underlying structure to facilitate via formation over conductive materials. Modifying a structure in this manner may pose other risks, however. For example, some etching processes or materials may inadvertently modify the structure or properties of the underlying metal wires, refractory metal liners, etc.

SUMMARY

A first aspect of the disclosure provides a method of forming an integrated circuit (IC) structure, the method including: providing a structure including a conductor and a refractory metal liner each positioned within an insulator layer, wherein the refractory metal liner separates the conductor from the insulator layer, and wherein an upper surface of the insulator layer is substantially coplanar with an upper surface of the conductor and an upper surface of the refractory metal liner; forming a reaction layer on the upper surface of the conductor, the upper surface of the refractory metal liner, and the upper surface of the insulator layer; annealing the reaction layer such that a region of the reaction layer over the conductor reacts with the conductor to form a semiconductor-metal alloy region; removing a portion of the reaction layer to expose the refractory metal liner; removing a portion of the refractory metal liner to approximately a depth of the semiconductor-metal alloy region; and removing the semiconductor-metal alloy region to expose a portion of the conductor such that a remainder of the conductor and a remainder of the refractory metal liner are recessed relative to an upper surface of the insulator layer.

A second aspect of the disclosure provides a method of forming an integrated circuit (IC) structure, the method including: providing a structure including a conductor and a refractory metal liner each positioned within an insulator layer, wherein the refractory metal liner separates the conductor from the insulator layer, and wherein an upper surface of the insulator layer is substantially coplanar with an upper surface of the conductor and an upper surface of the refractory metal liner; forming a reaction layer on the upper surface of the conductor, the upper surface of the refractory metal liner, and the upper surface of the insulator layer; annealing the reaction layer such that a region of the reaction layer over the conductor reacts with the conductor to form a semiconductor-metal alloy region; converting a remainder of the reaction layer to a dielectric film, wherein the dielectric film includes a masking region positioned on the insulator layer and a barrier region positioned on the semiconductor-metal alloy region; removing the barrier region of the dielectric film to expose the refractory metal liner and the semiconductor-metal alloy region; removing a portion of the refractory metal liner to approximately a depth of the semiconductor-metal alloy region; and removing the semiconductor-metal alloy region to expose a portion of the conductor such that the conductor and the refractory metal liner are recessed relative to an upper surface of the masking region.

A third aspect of the disclosure provides a method of forming an integrated circuit (IC) structure, the method including: providing a structure including: an insulator layer including a trench, a refractory metal liner including a first region conformally coating a lower surface and sidewalls of the trench, and a second region positioned on an upper surface of the insulator layer, a conductor formed within the trench and contacting the first region of the refractory metal liner; removing, with an etchant, the second portion of the refractory metal liner from the upper surface of the insulator layer, and to a predetermined depth within the insulator layer, wherein the removing causes the etchant to diffuse into a portion of the conductor to approximately the predetermined depth; and selectively removing the portion of the conductor having the diffused etchant therein.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely exemplary.

Figure 1:
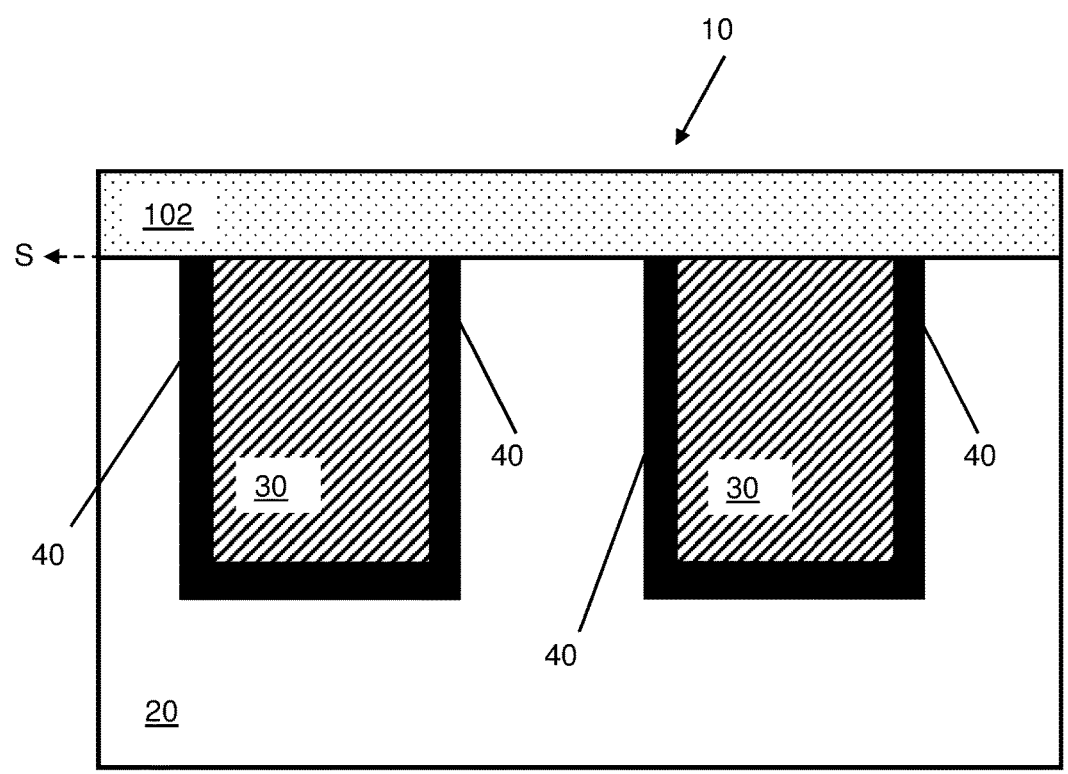
FIG. 1 shows a cross-sectional view of forming a reaction layer on a structure according to embodiments of the disclosure.

The disclosure relates to integrated circuit (IC) fabrication techniques for recessing a refractory metal liner and conductor for via formation thereto. Referring to FIG. 1, embodiments of the present disclosure include providing a structure 10 to be processed as discussed herein. The present disclosure relates to introducing topographical features (e.g., recessed portions and materials) to structure 10 to facilitate alignment with vias and/or other structures formed thereon. More specifically, the processes discussed herein can yield a recessed conductor and refractory metal liner for via formation thereon, without causing material degradation in the remaining portions of conductor and liner material. Structure 10 may be distinguished from a "substrate" (e.g., one or more semiconductor materials with electrical devices therein) by being fabricated in a back end of line (BEOL) process step. Thus, structure 10 may be positioned over a substrate (not shown) including, e.g., one or more semiconductive materials.

Structure 10 can include an insulator layer 20, e.g., in the form of an inter-metal dielectric (IMD) positioned over a semiconductor substrate and/or other component. Insulator layer 20 may be formed over the exposed surface(s) of underlying materials (semiconductive substrate materials, other metal layers, conductors and/or non-conductive structures), e.g., by deposition or any other currently-known or later developed process of forming a material. Materials beneath insulator layer 20, e.g., device layers, barrier films, etc., are omitted from the accompanying FIGS. 1-13 to better illustrate the materials formed and processed according to embodiments of the present disclosure. Insulator layer 20 may include one or more insulating materials, e.g., silicon nitride (SiN), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material, other low dielectric constant (<3.9) material, or layers thereof.

Precursor structure 10 can include one or more conductors 30 positioned within insulator layer 20. Two conductors 30 are shown by example in FIGS. 1-13, but it is understood that embodiments of the disclosure can be implemented, e.g., with a single conductor 30 or multiple (e.g., five, ten, fifty, one-hundred, one-thousand or more, etc.) conductors 30 in insulator layer 20. Conductor 30 may include, e.g., conductive wires, vias, etc., for providing electrical connections between two or more distinct elements of an integrated circuit (IC). Although not shown explicitly in the accompanying FIGS., conductor(s) 30 may be electrically coupled to one or more wires or other circuit elements positioned orthogonally (e.g., laterally adjacent into or out of the plane of the page) relative to the structures shown herein. Conductor(s) 30 can include one or more conductive metals for providing an electrical connection between components of an IC structure, and may include, e.g., Copper (Cu), Aluminum (Al), Tungsten (W), Molybdenum (Mo), Cobalt (Co), Nickel (Ni), Ruthenium (Ru), Platinum, (Pt), Palladium (Pa), Osmium (Os), Silver (Ag), Gold (Au), etc. Although conductor(s) 30 are illustrated as extending partially through insulator layer 20, one or more conductors 30 may extend completely through insulator layer 20 into underlying structures in different implementations.

In addition, each conductor 30 of precursor structure 10 can include a refractory metal liner ("liner," hereafter) 40 formed on the lower surface and sidewalls of a trenched region of insulator layer 20 before conductor 30 is formed therein. Liners 40 can separate conductor 30 from insulator layer 20. Furthermore, an upper surface of liners 40 can be substantially coplanar with an upper surface of insulator layer 20 and conductor 30, e.g., along line S as illustrated. The upper surface of structure 10 may be made coplanar along line S, e.g., by any process for planarizing or selectively removing portions of an exposed material. This planarization step can serve to remove the excess metal at the top surface to provide electrical separation between the interconnect lines. Polishing generally refers to any process applied to either reduce roughness of a component's surface, e.g., using chemically reactive slurry or other currently-known or later developed reactive materials. Chemical mechanical planarization (CMP), in particular, provides a method of removing layers of solid by chemical-mechanical polishing carried out for the purpose of surface planarization and definition of a metal interconnect pattern and/or other connecting element. Liners 40 may include one or more refractory metals, refractory metal compounds, etc., e.g., tantalum nitride (TaN), tantalum (Ta), ruthenium (Ru) titanium (Ti), tungsten (W), iridium (Ir), rhodium (Rh) and platinum (Pt), etc., or mixtures, alloys, etc., thereof. For instance, liner(s) 40 may include titanium nitride (TiN), tantalum nitride (TaN), and/or other refractory metal compounds or alloys which may have reduced conductivity relative to other conductive materials. Liners 40 may be formed to reduce electromigration and/or other structural and performance losses during operation.

Processes discussed herein can alter the surface topography of structure 10 by modifying the relative sizes, shapes, etc., of components within structure 10. The present disclosure can include, e.g., forming a reaction layer 102 on the upper surfaces of insulator layer 20, conductors 30, and liner 40. Reaction layer 102 can include, e.g., one or more currently-known or later developed semiconductive substances generally used in semiconductor manufacturing, including without limitation: silicon (e.g., crystal silicon), germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable materials for reaction layer 102 can include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Reaction layer 102 may be formed on structure 10, e.g., by deposition and/or any other currently-known or later developed process of forming a material on exposed surfaces of a structure. As used herein, the term "deposition" generally refers to any currently known or later developed technique appropriate for insulator 102 or other materials to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and/or evaporation. After being formed, reaction layer 102 may have a thickness of, e.g., up to approximately 0.01 micrometers (μm). In further embodiments, reaction layer 102 may have a thickness of between approximately 0.0001 μm and approximately 0.2 μm.

Figure 2:
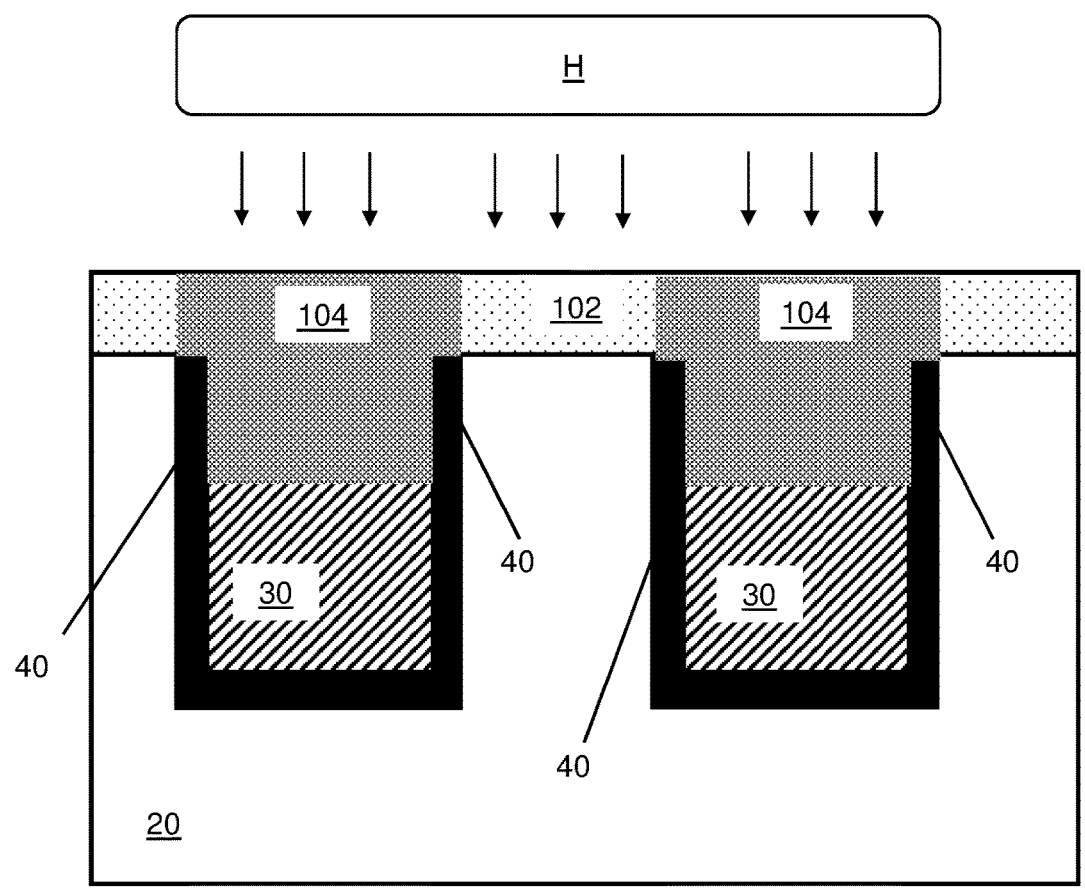
FIG. 2 shows a cross-sectional view of annealing a reaction layer to form semiconductor-metal alloy regions according to embodiments of the disclosure.

Turning to FIG. 2, embodiments of the disclosure can include reacting reaction layer 102 with conductor 30 to form semiconductor-metal alloy(s), e.g., a silicide or other conductive material produced by reacting a semiconductor with a metal at elevated temperature. As shown, reaction layer 102 can be annealed by an external heat source H (e.g., a flashlamp, laser, heating plate, etc.) to selectively form a semiconductor-metal alloy region 104 within conductor 30 and reaction layer 102. Annealing reaction layer 102 with heat source H can cause regions of reaction layer 102 positioned above conductor 30 to diffuse into and react with conductor 30, and vice versa. Heat source H can anneal reaction layer 102 at a temperature of, e.g., approximately two-hundred degrees Celsius (° C.). Semiconductor-metal alloy region 104 thus may include one or more conductive compounds including one or more materials originating from conductor 30 (e.g., copper (Cu), aluminum (Al), tungsten (W), etc.) and/or one or more semiconductor substances originating from reaction layer 102 discussed herein. In embodiments where reaction layer 102 includes a semiconductor other than silicon (e.g., amorphous germanium), "semiconductor-metal alloy" includes any metallic-semiconductor compound produced by annealing a semiconductor in contact with a conductive metal. As shown, semiconductor-metal alloy region 104 can extend into portions of semiconductor material positioned above boundary between insulator layer 20 and reaction layer 102. Similarly, semiconductor-metal alloy region 104 can extend into conductor 30 to a predetermined depth. As shown, semiconductor-metal alloy region 104 can span the entire thickness of reaction layer 102 over conductor 30. According to an example, semiconductor-metal alloy region 104 can extend beneath the upper surface of insulator layer 20, e.g., to a depth of approximately 0.01 μm.

Figure 3:
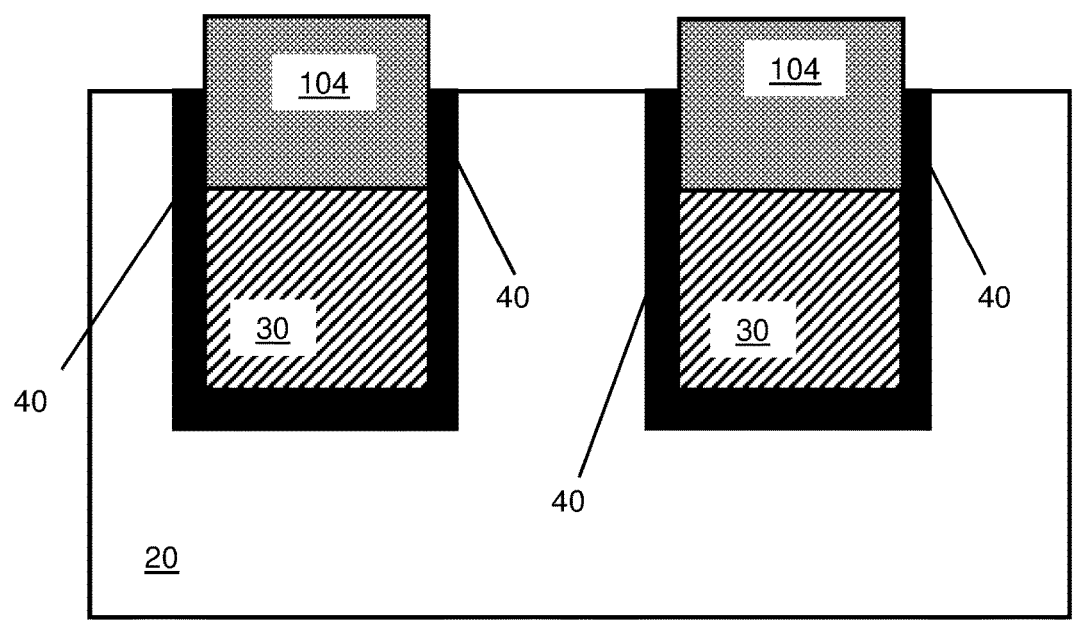
FIG. 3 shows a cross-sectional view of removing a remaining reaction layer according to embodiments of the disclosure.

Turning to FIG. 3, the disclosure can include removing at least a portion of reaction layer 102 to expose portions of liner 40 and, optionally, insulator layer 20 positioned thereunder. Reaction layer 102 can be removed by the use of one or more etchants selective to semiconductor materials. "Etching" generally refers to the removal of material from a structure (or structures formed on the structure), and is often performed with a mask in place so that material may selectively be removed from certain areas of the structure, while leaving the material unaffected, in other areas of the structure. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as shallow isolation trenches (SIT). Reaction layer 102 can also be removed by forming a mask (not shown) on semiconductor-metal alloy region(s) 104 and using a non-selective etchant to remove portions of reaction layer 102 not covered by the mask. In such instances, portions of insulator layer 20 positioned beneath reaction layer 102 may also be removed by the same etchant. As shown, a remainder of reaction layer 102 not previously converted into semiconductor-metal alloy region(s) 104 can be removed to expose insulator layer 20 and liner(s) 40.

Figure 4:
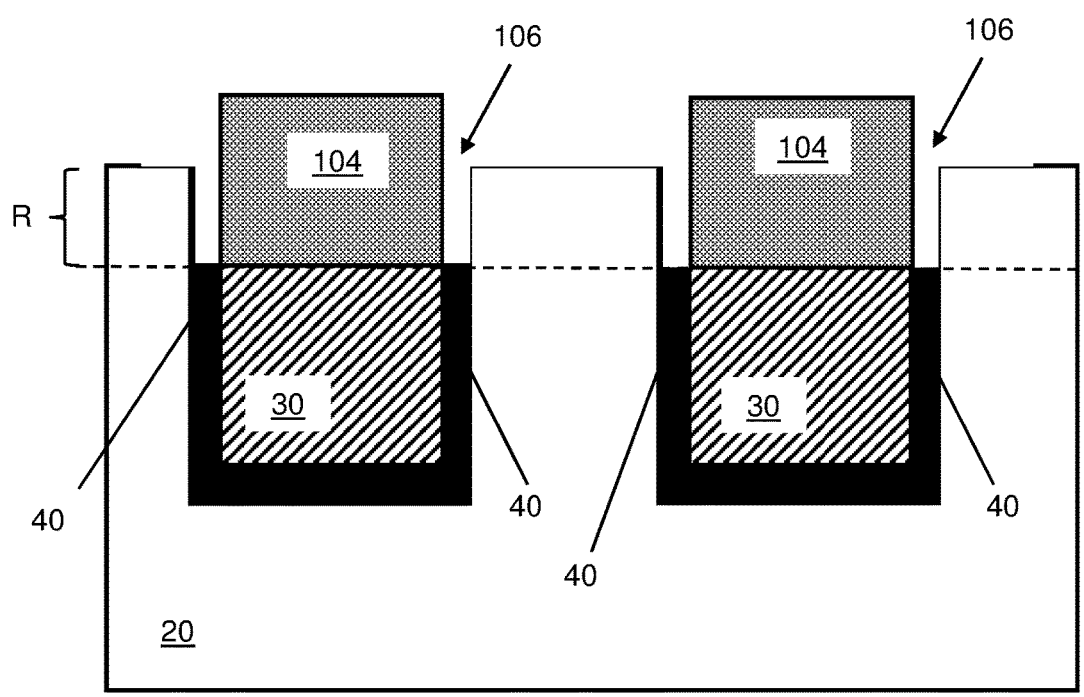
FIG. 4 shows a cross-sectional view of removing a portion of a refractory metal liner according to embodiments of the disclosure.

Referring to FIG. 4, the disclosure can include removing exposed portions of liner(s) 40 to approximately the depth of semiconductor-metal alloy region(s) 104. Liner(s) 40 can be removed by way of any currently known or later-developed process for removing a material from an IC structure, and generally can include selective and/or non-selective etching of liner(s) 40. In an example, a user can remove portions of liner(s) 40 by etching liner(s) 40 with an etchant selective to semiconductor-metal alloy region(s) 104 and, optionally, insulator layer 20. Such etchants may include, e.g., sulfur hexafluoride ($SF_6$), xenon difluoride ($XeF_2$), carbon tetrafluoride ($CF_4$), etc. In this case, liner(s) 40 can be etched with a predetermined amount of etchant and/or over a predetermined time to form interstitial recesses 106 laterally between insulator layer 20 and semiconductor-metal alloy region(s) 104. Interstitial recesses 106 can extend to a depth R within insulator layer 20. According to an example, depth R within interstitial recess 106 be up to, e.g., approximately 0.01 μm, or, e.g., between approximately 0.0001 μm and approximately 0.2 μm. To control the size of depth R to which interstitial recess(es) 106 extend, a fabricator can apply a predetermined amount of etchant, etch targeted portions of liner(s) 40 for a predetermined time, and/or use intermediate materials (e.g., etch stop materials, markers, etc.). After interstitial recess(es) 106 are formed, a lower surface of interstitial recess 106 can be substantially coplanar with a lower surface of semiconductor-metal alloy region(s) 104. Among other technical and commercial advantages, the separate removing of liner(s) 40 shown in FIG. 4 before subsequent removal of semiconductor-metal alloy region(s) 104 as discussed herein can prevent contamination of underlying conductor(s) 30 by etchants selective to liner(s) 40.

Figure 5:
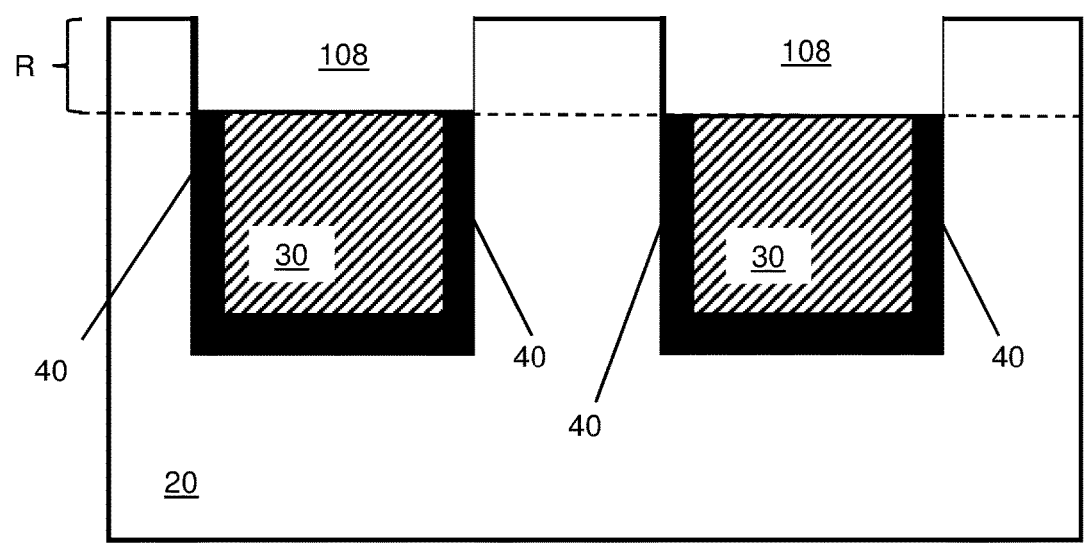
FIG. 5 shows a cross-sectional view of removing a semiconductor-metal alloy region according to embodiments of the disclosure.

Turning to FIG. 5, embodiments of the disclosure can include removing semiconductor-metal alloy region(s) 104 to expose conductor 30 thereunder. Semiconductor-metal alloy region(s) 104 can be removed by any currently known or later-developed technique for removing semiconductor-metal alloy materials without significantly affecting or removing other portions of a device. Semiconductor-metal alloy region(s) 104 can by removed by one or more conventional wet etchants, e.g., diluted hydrofluoride (dHF) solutions, SPM or "Piranha" solutions including sulfuric acid ($H_2SO_4$) and hydrogen peroxide ($H_2O_2$), phosphoric acid ($H_3PO_4$) based etchants, or other conventional wet etching materials. Selectively removing semiconductor-metal alloy region(s) 104 can leave conductor(s) 30 thereunder intact along with remaining portions of liner(s) 40. Together, conductor(s) 30 and liner(s) 40 can be recessed relative to an upper surface of insulator layer 20, e.g., to a predetermined depth R. The areas previously occupied by removed liner(s) 40 and semiconductor-metal alloy region(s) 104 (FIGS. 2-4) can form recesses 108. A fabricator can form vias and/or other connecting structures to exposed conductor(s) 30 in other processes as discussed elsewhere herein. Alternative implementations and process variants to form recesses 108 are discussed in further detail herein, with subsequent formation of vias, wires, etc., being addressed separately.

Figure 6:
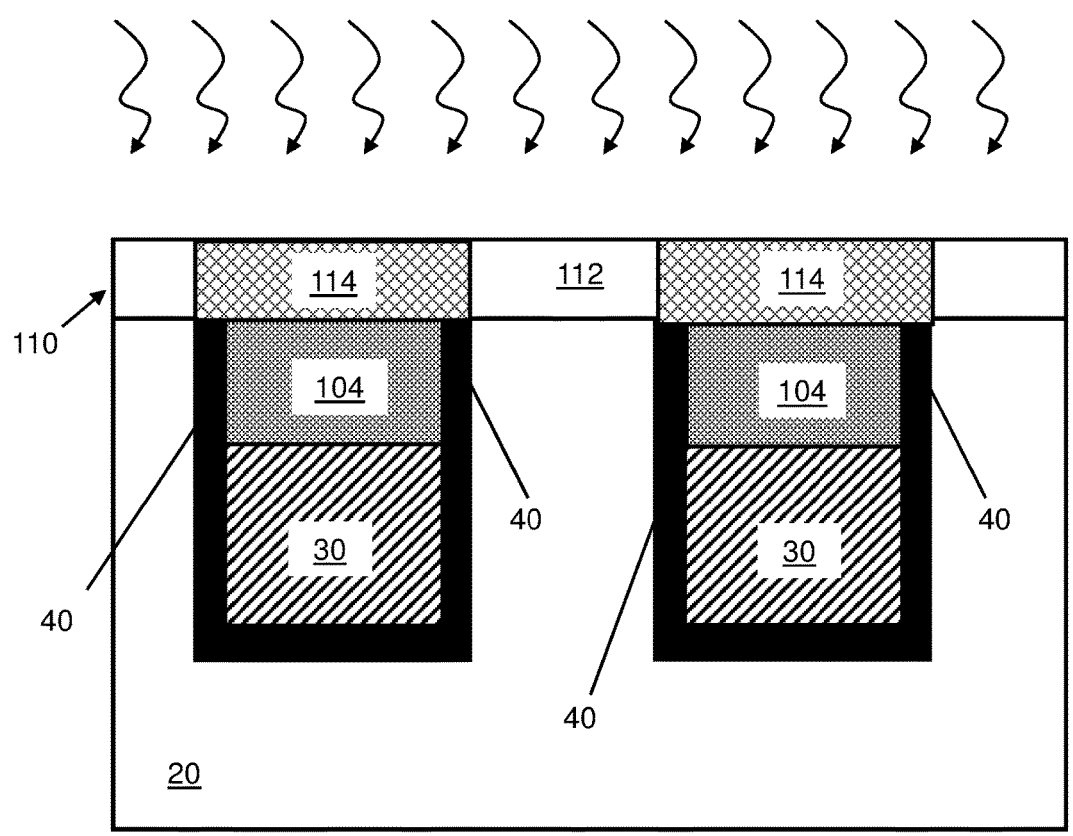
FIG. 6 shows a cross-sectional view of forming a semiconductor-metal alloy and thereafter converting a reaction layer to a dielectric film according to embodiments of the disclosure.

Turning to FIGS. 2 and 6 together, embodiments of the disclosure include removing liner(s) 40 by modified processes before removing semiconductor-metal alloy region(s) 104 to form recesses 108 (FIG. 5). The variants in processing discussed herein may be combined or used separately to accommodate different types of structures and/or to address technical distinctions, e.g., differences in material composition between dielectric layers 20, conductors 30, liners 40, etc. FIG. 6 depicts a process of converting reaction layer 102 and semiconductor-metal alloy region(s) 104 to a dielectric film 110 after annealing reaction layer 102 as described herein. Converting reaction layer 102 and semiconductor-metal alloy region(s) 104 into dielectric film 110 can generally include exposing reaction layer 102 and semiconductor-metal alloy region(s) 104 to a gas (e.g., oxygen or nitrogen, depicted with arrows in FIG. 6) at an elevated temperature, e.g., between approximately 800° C. and approximately 1100° C. in $O_2$ or $H_2O$ steam to yield a thermal oxidation reaction. Using plasma assistance, such as an ionized Oxygen or Nitrogen plasma, or UV assistance can reduce the process temperature to less than approximately 400° C., making it suitable for BEOL processing. Such exposure can cause reaction layer 102 and semiconductor-metal alloy region(s) 104 to react with the gas to form dielectric compounds, e.g., silicon oxide or silicon oxide from silicon in reaction layer 102, and oxide or nitride compounds (e.g., $Cu_3SiO_x$ or $Cu_3SiN_x$) from semiconductor-metal alloy region(s) 104. Converting reaction layer 102 and semiconductor-metal alloy region(s) 104 into dielectric film 110 can yield a masking region 112 positioned on insulator layer 20 and a barrier region 114 positioned on semiconductor-metal alloy region(s) 104. The previous annealing of reaction layer 102, and reaction chemistry with semiconductor-metal alloy region(s) 104, can cause barrier region(s) 114 to be formed only over semiconductor-metal alloy region(s) 104 as shown. The processes discussed herein thus may not require separate masking and/or processing of exposed material for targeted formation of masking regions 112 and barrier regions 114 in dielectric film 110.

Figure 7:
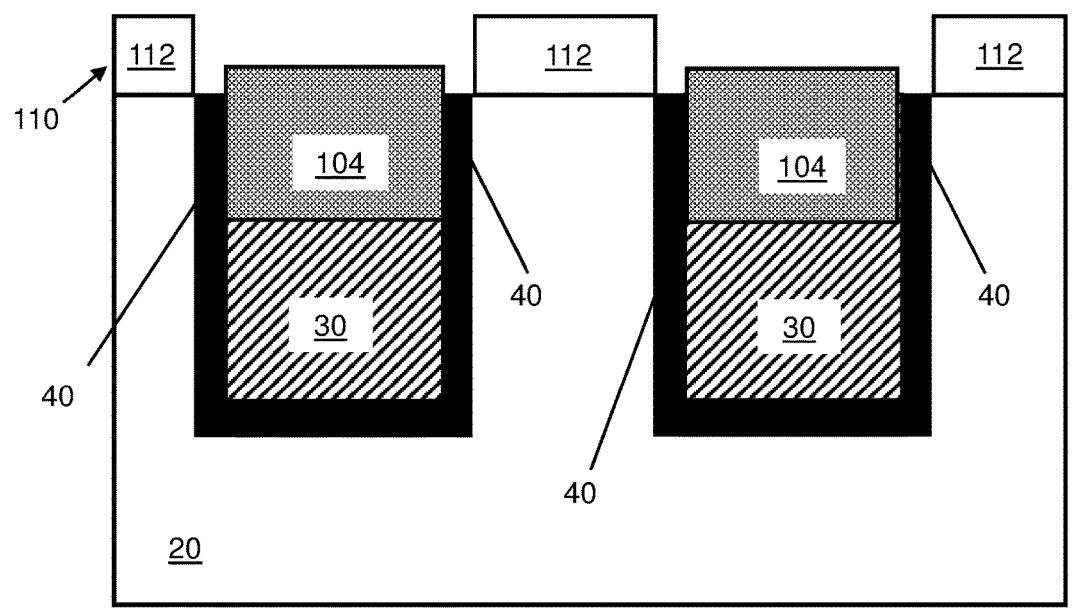
FIG. 7 shows a cross-sectional view of removing a barrier region of the dielectric film according to embodiments of the disclosure.

Turning to FIG. 7, the present disclosure includes removing barrier region(s) 114 of dielectric film 110 to expose liner(s) 40 and semiconductor-metal alloy region(s) 104 thereunder. The removing of barrier region(s) 114 can include applying one or more etchants, e.g., etching materials selective to masking region(s) 112 to remove barrier region(s) 114 and portions of semiconductor-metal alloy region(s) 104 without affecting underling materials such as insulator layer 20, conductor(s) 30, liner(s) 40, etc. Materials appropriate for selectively removing barrier region(s) 114 in dielectric film 110 can include one or more wet etchants discussed elsewhere herein for removing semiconductor-metal alloy region(s) 104, e.g., diluted hydrofluoride (dHF) solutions, SPM or "Piranha" solutions including sulfuric acid ($H_2SO_4$) and hydrogen peroxide ($H_2O_2$), phosphoric acid ($H_3PO_4$) based etchants, or other conventional wet etching materials. In any event, at least a portion of semiconductor-metal alloy region(s) 104 can remain intact after removing barrier region(s) 114, e.g., by applying a predetermined amount of etching material or etching barrier region(s) 114 over a predetermined time. As shown, upper surfaces of liner(s) 40 and semiconductor-metal alloy region(s) 104 can be exposed following the removing of barrier region(s) 114.

Figure 8:
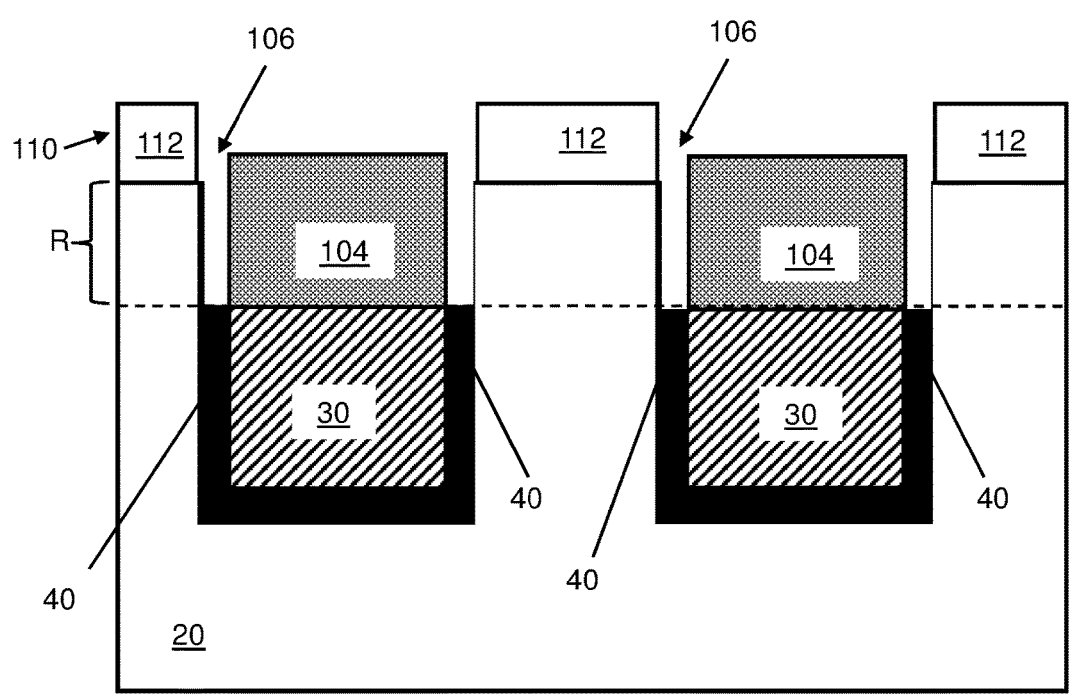
FIG. 8 shows a cross-sectional view of removing a portion of a refractory metal liner according to embodiments of the disclosure.

Referring to FIG. 8, further processing can include removing exposed portions of liner(s) 40 to approximately the depth of semiconductor-metal alloy region(s) 104 after selectively removing barrier region(s) 114 (FIG. 6) of dielectric film 110. Liner(s) 40 can be removed to depth R by one or more of the example techniques discussed elsewhere herein relative to FIG. 4 to form interstitial recesses 106 laterally between insulator layer 20 and semiconductor-metal alloy region(s) 104. To control the size of depth R to which interstitial recess(es) 106 extend, a fabricator can apply a predetermined amount of etchant, etch targeted portions of liner(s) 40 for a predetermined time, and/or use intermediate materials (e.g., etch stop materials, markers, etc.). As discussed herein, etching materials appropriate for creating interstitial recesses from liner(s) 40 may include, e.g., sulfur hexafluoride ($SF_6$) xenon difluoride ($XeF_2$), carbon tetrafluoride ($CF_4$), etc. As also noted with respect to FIG. 4, interstitial recesses 106 can extend to depth R within insulator layer 20, such that a lower surface of interstitial recess 106 is substantially coplanar with a lower surface of semiconductor-metal alloy region(s) 104. At least some portions of masking region(s) 112 of dielectric film 110 can remain intact upon insulator layer 20 as interstitial recesses 106 are formed from liner(s) 40. However, it is understood that forming interstitial recesses 106 as described herein can also remove some portions of masking region(s) 112.

Figure 9:
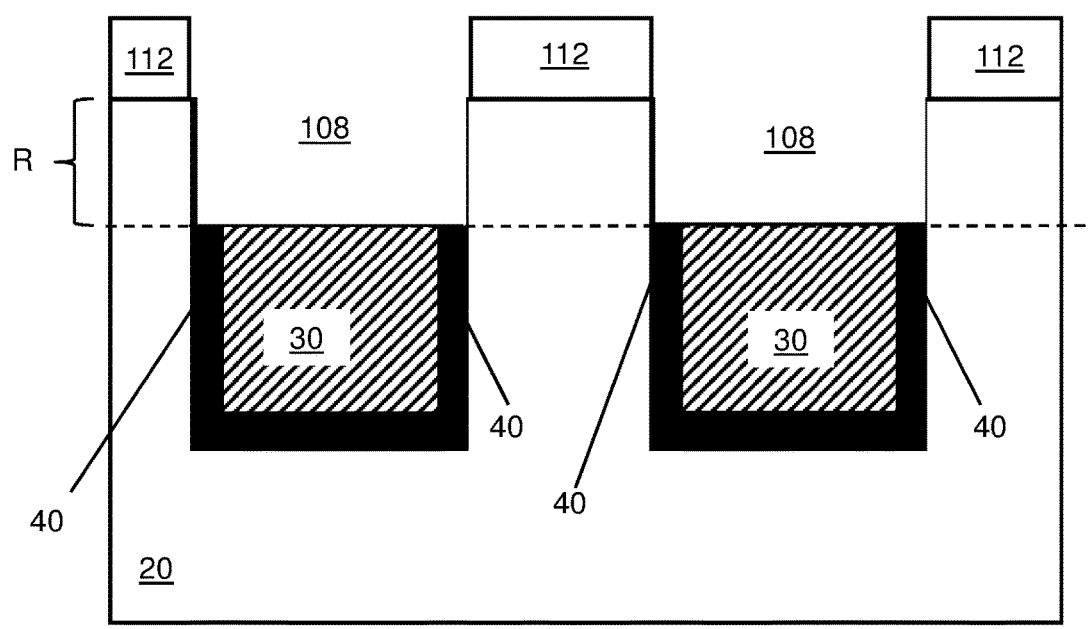
FIG. 9 shows a cross-sectional view of removing a semiconductor-metal alloy region according to embodiments of the disclosure.

Referring to FIG. 9, the present disclosure includes removing semiconductor-metal alloy region(s) 104 to expose conductor 30 thereunder. As described elsewhere herein, semiconductor-metal alloy region(s) 104 can by removed by one or more conventional wet etchants, e.g., diluted hydrofluoride (dHF) solutions, SPM or "Piranha" solutions including sulfuric acid ($H_2SO_4$) and hydrogen peroxide ($H_2O_2$), phosphoric acid ($H_3PO_4$) based etchants, or other conventional wet etching materials. Selectively removing semiconductor-metal alloy region(s) 104 can recess conductor(s) 30 and liner(s) 40, e.g., to depth R, relative to an upper surface of insulator layer 20. As also noted herein, the removed portions of liner(s) 40 and the removed semiconductor-metal alloy region(s) 104 (FIGS. 6-8) can form recesses 108. Masking region(s) 112 of dielectric film 110 can remain intact over insulator layer 20 before vias and/or other structures are formed to the recessed conductor(s) 30, or may be removed separately through a different process.

Figure 10:
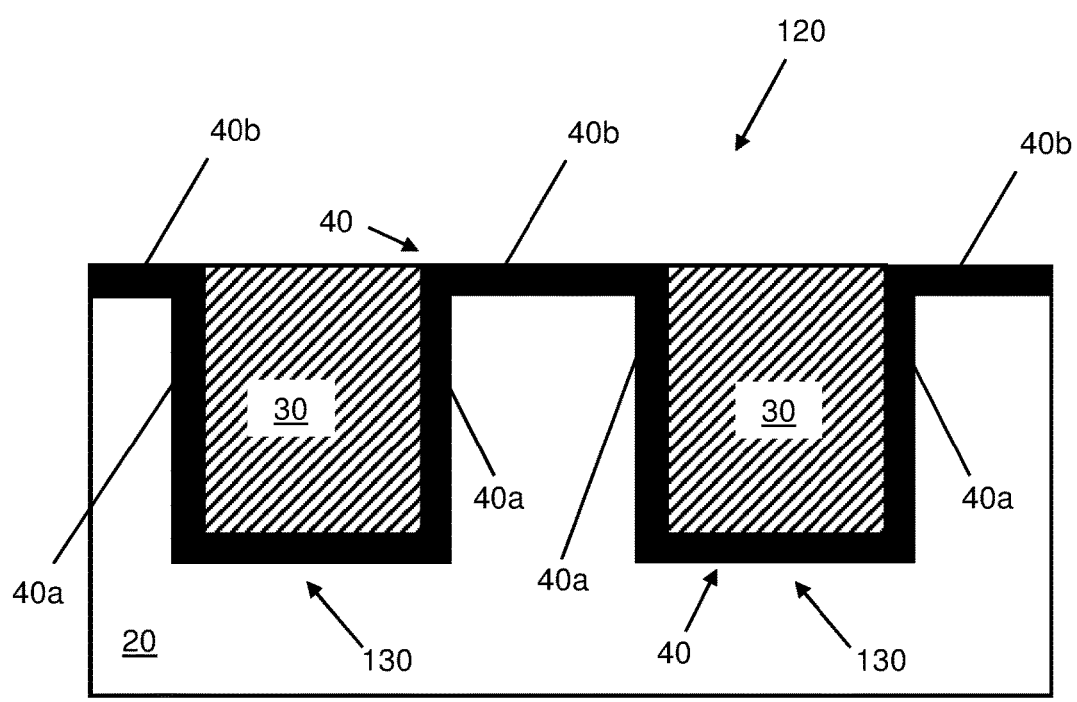
FIG. 10 shows a cross-sectional view of a structure to be processed according to embodiments of the disclosure.

Turning to FIG. 10, embodiments of the present disclosure can include processing a structure 120 with modified and/or additional characteristics relative to structure 100. Rather than forming semiconductor-metal alloy region(s) 104 (FIGS. 2-4, 6-8), the disclosure can include deliberately introducing one or more contaminants (diffused etchants as described herein) into a portion of conductor(s) 30 before removing portions of liner(s) 40, and thereafter removing the contaminated portions of conductor(s) 30. As illustrated in FIG. 10, structure 120 can include insulator 20 with one or more trenches 130 positioned therein. Liner(s) 40 can include a first portion 40a conformally coating the bottom surface and sidewalls of trench(es) 130. Liner(s) 40 can also include a second portion 40b formed on an upper surface of insulator layer 20. Each portion 40a, 40b of liner 40 can include the same or similar materials, e.g., one or more materials described herein with respect to liner(s) 40 (FIGS. 1-9). First and second portions 40a, 40b of liner 40 can be formed within trench(es) 130 and on insulator layer 20, e.g., by any currently known or later-developed technique for conformally coating a refractory metal onto an exposed insulator material. Conductor(s) 30 can be positioned within trench(es) 130 and in contact with first portion(s) 40a of liner(s) 40.

Figure 11:
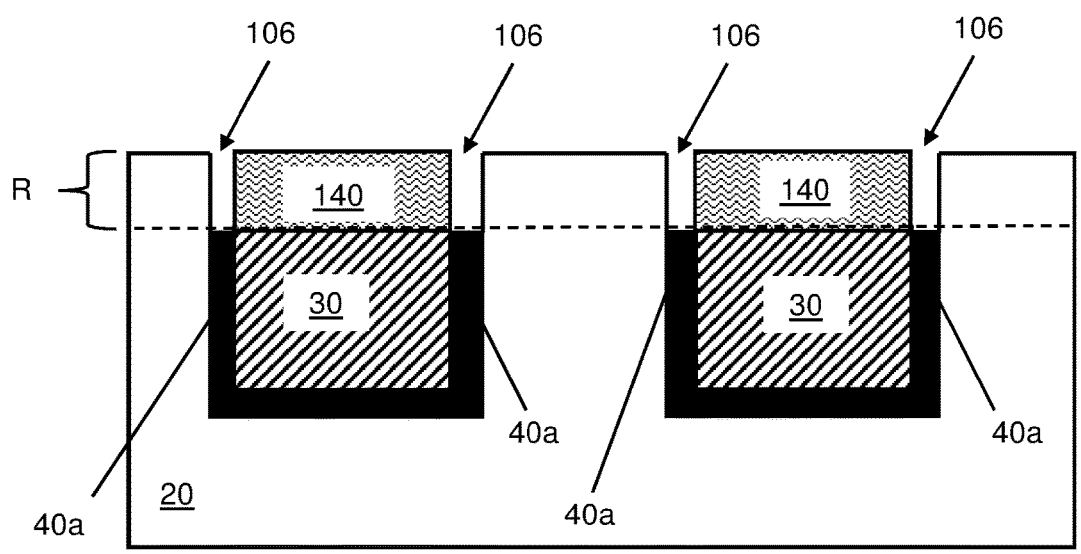
FIG. 11 shows a cross-sectional view of removing a portion of a refractory metal liner according to embodiments of the disclosure.

Turning now to FIG. 11, the disclosure includes removing at least second portion 40b (FIG. 10), and an upper region of first portion 40a, of liner(s) 40 with an etchant. At least some of first portion 40a can remain intact after other portions of liner(s) 40 have been removed. Second portion 40b of liner(s) 40 can be removed with one or more etchants selective to the refractory metals within liner(s) 40. As examples, etching materials such as sulfur fluoride ($SF_6$), tetrafluoromethane ($CF_4$) or hydrogen bromide (HBr) used in a plasma based dry etch process, or xenon difluoride ($XeF_2$) in a vapor process, can remove second portion 40b of liner(s) 40 to predetermined depth R without causing a corresponding etch to insulator layer 20 and/or conductor(s) 30 (FIG. 10). Nevertheless, the etchant(s) used for removing second portion 40b can diffuse into exposed portions of conductor 30 to yield contaminated conductor(s) 140 positioned over the remainder of conductor(s) 30. Removing second portion 40b of liner(s) 40 to depth R can yield interstitial recesses 106 positioned laterally between insulator layer 20 contaminated conductor(s) 140. To control the size of depth R to which interstitial recess(es) 106 extend, a fabricator can apply a predetermined amount of etchant, etch targeted portions of liner(s) 40 for a predetermined time, and/or use intermediate materials (e.g., etch stop materials, markers, etc.). Contaminated conductor(s) 140 can include the original material composition of conductor(s) 30 (e.g., one or more conductive metals and/or alloys thereof) in addition to diffused etchant materials (e.g., $SF_6$ or HBr) which entered conductor 30 during the removal of second portion 40b of liner(s) 40, but did not cause significant deterioration of conductor 30. Removing second portion 40b of liner(s) 40 to depth R can cause contaminated conductor(s) 140 to extend to approximately the same predetermined depth R (e.g., up to approximately 0.01 μm, or, e.g., between approximately 0.001 μm and approximately 0.2 μm below the upper surface of insulator layer 20.

Figure 12:
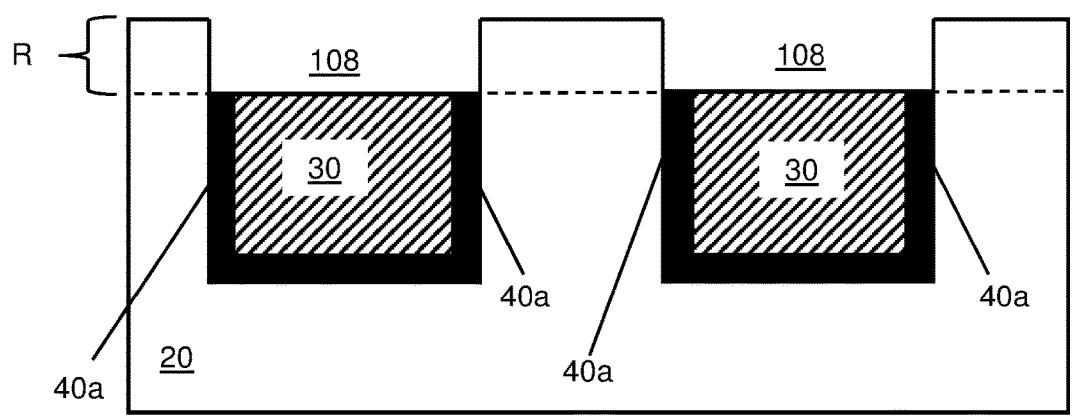
FIG. 12 shows a cross-sectional view of removing a conductor contaminated by a diffused etchant therein according to embodiments of the disclosure.

Turning to FIG. 12, the present disclosure can include selectively removing contaminated conductor(s) 140 (FIG. 11) to expose conductor 30 and form recesses(es) 108 to depth R, as discussed elsewhere herein. Contaminated conductor(s) 140 can be removed, e.g., by stripping away contaminated conductor(s) 140 with a plasma or similar material selectively to insulator layer 20, conductor(s) 30 without diffused etchants therein, and liner(s) 40. In further embodiments, one or more etchants (e.g., selective or non-selective etchants with varying etch rates) can alternatively be used to remove contaminated conductor(s) 140 to depth R beneath the upper surface of insulator layer 20. Regardless of the specific materials or processes used, removing contaminated conductor(s) 140 can yield recess(es) 108 to depth R with conductor(s) 30 and first portion 40a of liner(s) 40 being recessed relative to the upper surface of insulator layer 20. As demonstrated with other processing variants described herein, removing portions of conductor(s) 30 and portions of liner(s) 40 to depth R in separate processes can reduce or prevent the diffusion of etchants and/or other materials into the remaining insulator layer 20, conductor(s) 30, and/or liner(s) 40 to prevent misalignment between conductor(s) 30 and vias formed thereon.

Figure 13:
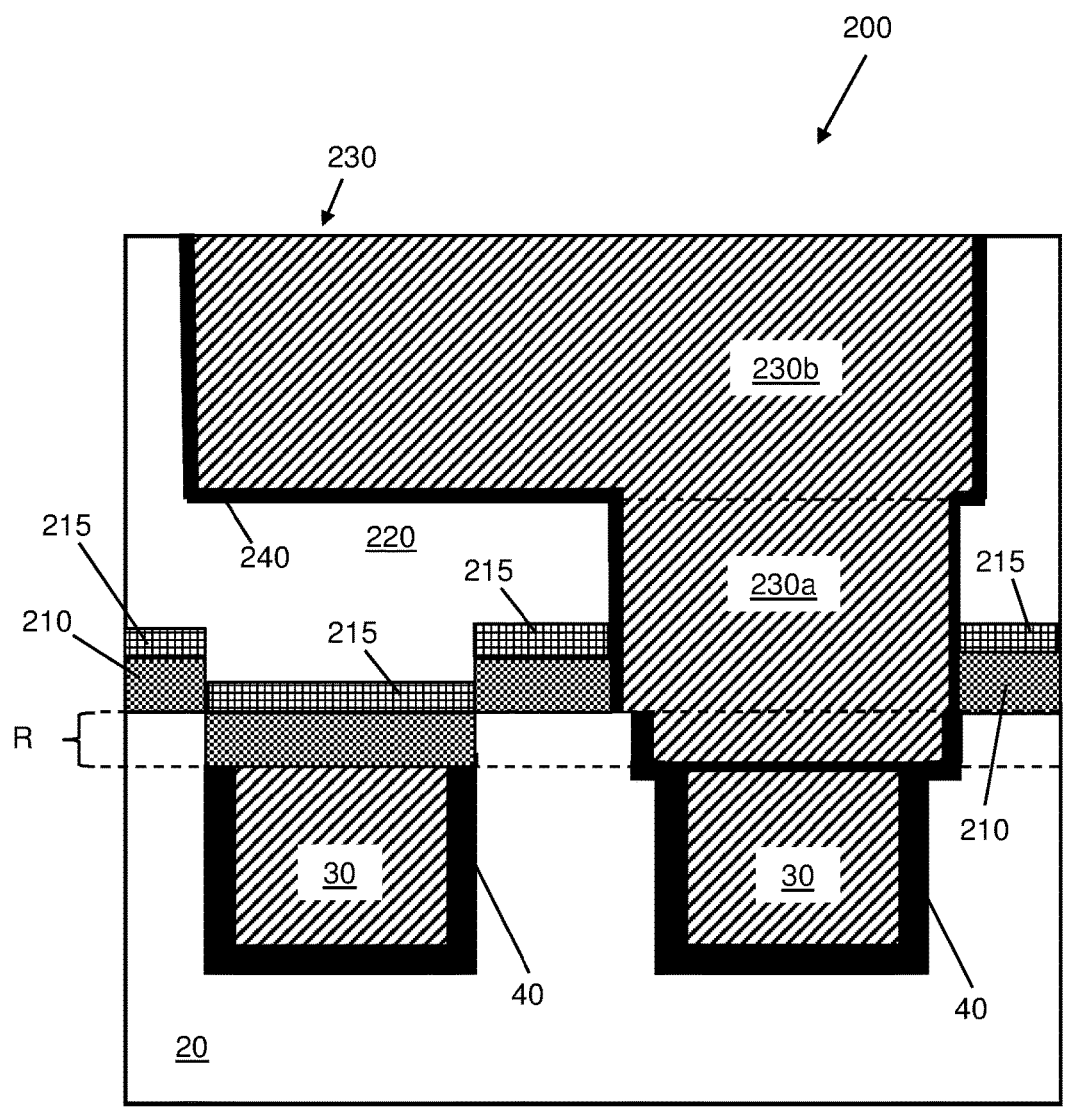
FIG. 13 shows a cross-sectional view of forming an insulator layer and via over a recessed conductor and refractory metal liner according to embodiments of the disclosure.

Referring to FIG. 13, further processes according to the disclosure can include forming additional circuit structures on conductor(s) 30 after conductor(s) 30 and liner(s) 40 have been recessed to depth R as described herein. The remaining structures and processes can be implemented by way of any currently known or later-developed technique, thereby allowing a fabricator to integrate the various processes described herein into other fabrication techniques. An IC structure 200 according to the disclosure can include insulator layer 20 with conductor(s) 30 therein and corresponding liner(s) 40 separating conductor(s) 30 from insulator layer 20. Conductor(s) 30 and liner(s) 40 can also be recessed to depth R from the upper surface of insulator layer 20 as described herein. To form IC structure 200, a first barrier film 210 and, optionally, a second barrier film 215 can be formed on insulator layer 20 and exposed surfaces of conductor(s) 30 and liner(s) 40 to provide structural and electrical separation between successive metal layers. First barrier film 210 can include one or more insulating materials, and according to one embodiment may include silicon carbon nitride (SiCN). Second barrier film 215 can similarly include one or more insulating materials, and according to one embodiment may include aluminum nitride (AlN) or other layer that can provide a different etch rate to insulator layer 20. First and second barrier films 210, 215 may collectively be referred to as a "non-conformal dual barrier."

An overlying insulator layer 220 can thereafter be formed on first and/or second barrier films 210, 215. Overlying insulator layer 220 can include, e.g., one or more of the example materials discussed relative to insulator layer 20, or may include different insulating materials. After overlying insulator layer 220 is formed, portions thereof can be patterned for removal (e.g., with one or more masks, not shown), and removed along with underlying portions of first or second barrier films 210, 215 according to any currently known or later-developed process for removing insulating and barrier materials (e.g., selective or non-selective etching). A conductor 230 and corresponding liner 240 can be formed within the removed portions of overlying insulator 220. Conductor 230 can include, e.g., a via 230a and metal wire 230b formed together through dual damascene fabrication. Conductor 230 and liner 240 can include, e.g., the same or similar materials used to form conductor(s) 30 and liner(s) 40, respectively. Via 230a of conductor 230 may be formed to one underlying conductor 30 in a particular cross-section, while other metal wires 230b or other portions of conductor 230 can include via(s) 230a to other underlying conductor(s) 30 in other portions of IC structure 200. In any event, prior recessing of conductor(s) 30 and liner(s) 40 can improve the alignment between via(s) 230a and underlying conductors without introducing contaminants and/or further modifications to other elements, e.g., insulator layer 20, liner(s) 40, etc.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming an integrated circuit (IC) structure, the method comprising:
    providing a structure including a conductor and a refractory metal liner each positioned within an insulator layer, wherein the refractory metal liner separates the conductor from the insulator layer, and wherein an upper surface of the insulator layer is substantially coplanar with an upper surface of the conductor and an upper surface of the refractory metal liner;
    forming a reaction layer on the upper surface of the conductor, the upper surface of the refractory metal liner, and the upper surface of the insulator layer;
    annealing the reaction layer such that a region of the reaction layer over the conductor reacts with the conductor to form a semiconductor-metal alloy region;
    removing a portion of the reaction layer and an underlying portion of the insulator layer to expose the refractory metal liner;
    removing a portion of the refractory metal liner to approximately a depth of the semiconductor-metal alloy region; and
    removing the semiconductor-metal alloy region to expose a portion of the conductor such that a remainder of the conductor and a remainder of the refractory metal liner are recessed relative to an upper surface of the insulator layer.

2. The method of claim 1, wherein the reaction layer comprises one of amorphous silicon, polycrystalline silicon, amorphous germanium, or polycrystalline germanium.

3. The method of claim 1, wherein the annealing includes annealing the reaction layer at a temperature of approximately 200 degrees Celsius (° C.).

4. The method of claim 1, wherein removing the portion of the refractory metal liner comprises etching the refractory metal liner with an etchant selective to the semiconductor-metal alloy region.

5. The method of claim 1, wherein removing the semiconductor-metal alloy region comprises etching the semiconductor-metal alloy region with a wet etchant.

6. The method of claim 1, further comprising forming an overlying insulator layer on the insulator layer, and forming a via to the conductor within the overlying insulator layer.

7. The method of claim 1, wherein the conductor comprises a plurality of conductors within the insulator layer, and wherein the refractory metal liner comprises a plurality of refractory metal liners positioned between the insulator and one of the plurality of conductors.

8. A method of forming an integrated circuit (IC) structure, the method comprising:
   providing a structure including a conductor and a refractory metal liner each positioned within an insulator layer, wherein the refractory metal liner separates the conductor from the insulator layer, and wherein an upper surface of the insulator layer is substantially coplanar with an upper surface of the conductor and an upper surface of the refractory metal liner;
   forming a reaction layer on the upper surface of the conductor, the upper surface of the refractory metal liner, and the upper surface of the insulator layer;
   annealing the reaction layer such that a region of the reaction layer over the conductor reacts with the conductor to form a semiconductor-metal alloy region;
   converting a remainder of the reaction layer to a dielectric film, wherein the dielectric film includes a masking region positioned on the insulator layer and a barrier region positioned on the semiconductor-metal alloy region;
   removing the barrier region of the dielectric film to expose the refractory metal liner and the semiconductor-metal alloy region;
   removing a portion of the refractory metal liner to approximately a depth of the semiconductor-metal alloy region; and
   removing the semiconductor-metal alloy region to expose a portion of the conductor such that the conductor and the refractory metal liner are recessed relative to an upper surface of the masking region.

9. The method of claim 8, wherein the reaction layer comprises one of amorphous silicon, polycrystalline silicon, amorphous germanium, or polycrystalline germanium.

10. The method of claim 8, wherein the converting includes reacting the reaction layer with one of oxygen or nitrogen.

11. The method of claim 8, wherein the annealing includes annealing the reaction layer at a temperature of approximately 200 degrees Celsius (° C.).

12. The method of claim 8, wherein removing the portion of the refractory metal liner comprises etching the refractory metal liner with an etchant selective to the semiconductor-metal alloy region.

13. The method of claim 8, wherein removing the semiconductor-metal alloy region comprises etching the semiconductor-metal alloy region with a wet etchant.

14. The method of claim 8, further comprising forming an overlying insulator layer on the insulator layer, and forming a via to the conductor within the overlying insulator layer.

15. The method of claim 8, wherein the conductor comprises a plurality of conductors within the insulator layer, and wherein the refractory metal liner comprises a plurality of refractory metal liners positioned between the insulator and one of the plurality of conductors.

16. A method of forming an integrated circuit (IC) structure, the method comprising:
   providing a structure including:
      an insulator layer including a trench,
      a refractory metal liner including a first portion conformally coating a lower surface and sidewalls of the trench, and a second portion positioned on an upper surface of the insulator layer,
      a conductor formed within the trench and contacting the first portion of the refractory metal liner;
   removing, with an etchant, the second portion of the refractory metal liner from the upper surface of the insulator layer, and the first portion of the refractory metal liner to a predetermined depth within the insulator layer, wherein the removing causes the etchant to diffuse into a portion of the conductor to approximately the predetermined depth; and
   selectively removing the portion of the conductor having the diffused etchant therein.

17. The method of claim 16, wherein the etchant comprises one of sulfur fluoride ($SF_6$) hydrogen bromide (HBr), tetrafluoromethane ($CF_4$), or xenon difluoride ($XeF_2$).

18. The method of claim 16, wherein an upper surface of the conductor and an upper surface of the refractory metal liner are recessed relative to the insulator layer, after the selectively removing of the portion of the conductor having the diffused etchant therein.

19. The method of claim 16, further comprising forming an overlying insulator layer on the insulator layer, and forming a via to the conductor within the overlying insulator layer.

* * * * *